United States Patent
Sakamoto et al.

(10) Patent No.: US 6,791,199 B2
(45) Date of Patent: Sep. 14, 2004

(54) HEAT RADIATING SEMICONDUCTOR DEVICE

(75) Inventors: Noriaki Sakamoto, Gunma (JP); Yoshiyuki Kobayashi, Gunma (JP); Junji Sakamoto, Gunma (JP); Yukio Okada, Gunma (JP); Yusuke Igarashi, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/810,104

(22) Filed: Mar. 16, 2001

(65) Prior Publication Data

US 2002/0027298 A1 Mar. 7, 2002

(30) Foreign Application Priority Data

Sep. 6, 2000 (JP) .................................... P. 2000-269466

(51) Int. Cl.$^7$ .............................................. H01L 23/28
(52) U.S. Cl. ..................... 257/787; 257/778; 257/779
(58) Field of Search ................. 257/778, 779, 257/787

(56) References Cited

U.S. PATENT DOCUMENTS

| | | | | |
|---|---|---|---|---|
| 5,391,924 A | * | 2/1995 | Uchida et al. | 257/788 |
| 6,011,694 A | * | 1/2000 | Hirakawa | 174/16.3 |
| 6,054,652 A | * | 4/2000 | Moriizumi et al. | 174/260 |

OTHER PUBLICATIONS

Harper, Electronic Packaging and Interconnection Handbook, 1991,McGraw–Hill, pp. 6.71–6.73.*

CSP Technology, and Mounting Material and Device Supporting the Technology–Special Issue of Denshi Zairyo.

* cited by examiner

Primary Examiner—Nathan J. Flynn
Assistant Examiner—Leonardo Andújar
(74) Attorney, Agent, or Firm—Fish & Richardson P.C.

(57) ABSTRACT

AS conductive patterns 11A to 11D are formed burying in a insulating resin 10 and a conductive foil 20 is formed being half-etched, thickness of the device is made thin. As an electrode for radiation 11D is provided, a semiconductor device superior in radiation is provided. Thickness of an electric connection means SD is substantially made definite as the electric connection means SD does not flow to a conductive path 11B by using a flow-prevention film DM.

28 Claims, 9 Drawing Sheets

HEAT RADIATING SEMICONDUCTOR DEVICE

BACKGROUND OF THE INVENTION

1. Field of the Invention

The present invention relates to a semiconductor device and a method of manufacturing the same, particularly a semiconductor device radiating excellently heat from the semiconductor device and a method of manufacturing the same.

2. Description of the Related Art

In recent years, use of IC package for portable equipment or small, hi-density mounting equipment progresses, and the conventional IC package and its concept of mounting are largely changing. These details are described in CSP technology, and mounting material and device supporting the technology-special issue of DENSHI ZAIRYO (p.22, September 1998).

FIG. 11 is a structure adopting a flexible sheet 50 as an interposer board, a copper foil pattern 51 is put on the flexible sheet through adhesive, and an IC chip is fixed. There is a pad for bonding 53 formed at periphery of the IC chip as the conductive pattern 51. A pad for connecting solder ball 54 is formed through a conductive path 51B formed in one body (integrally) with the pad for bonding 53.

At backside of the pad for connecting solder ball 54, an opening 56 where the flexible sheet is opened, and through the opening 56, a solder ball 55 is formed. The entire body is sealed with an insulating resin 58 using the flexible sheet 50 as a board. Symbol 57 is a thin metal wire.

On the other hand, FIG. 12 show a semiconductor device mounting an IC chips 52 with facedown method. Adopting a solder ball 60 instead of the thin metal wire 57, thickness of the entire IC chip 52 is made thin.

However the flexible sheet 50 provided below of IC chip is very expensive, and there are problems that cost rises, thickness of the package becomes thick, and weight increases.

There is a problem that heat resistance from a back face of the IC chip to a back face of the package becomes large in a supporting board because the supporting board comprises material other than metal. For said supporting board, there is a flexible sheet, a ceramic board, or a printed board. A heat conduction path comprising material good in heat conduction is the thin metal wire 57, the copper foil 51, and the solder ball 55, the above supporting board has a structure not to radiate fully at driving. Therefore there is a problem that driving current does not flow fully because of temperature rise of IC chip at driving.

In the facedown type semiconductor device shown in FIG. 12, the solder ball 60 flows to direction of an arrow 61, so that there is a problem that gap between the IC chip 52 and the flexible sheet 50 is not arranged horizontally.

Because of the problems, the gap between the IC chip 52 and the flexible sheet 50 becomes narrow, washing liquid does not fill in the gap, bad quality appears, and under-filling material is not filled.

SUMMARY OF THE INVENTION

The invention is carried out in view of the above problems, and intends to solve the above problems and obtain a reliable semiconductor device having a small package and a good radiation characteristics.

The problems are solved by surrounding an arranged area of said electrical connection means on a pad and providing a flow-prevention film resisting flow.

For example, by forming a flow-prevention film so as to surround an arranged area of solder, melted solder does not flow, the solder is fixed with designated thickness, and gap of a semiconductor and a pad is substantially defined.

The problem is solved by providing a flow-prevention film resisting flow of said electrical connection means on the pad and/or said conductive path.

By forming the flow-prevention film on Cu pattern comprising the pad, the conductive path, and the external connection electrode in one body so that brazing material does not form from the conductive path to the pad, solder gets wet only at the pad. Therefore by making sizes of plural pads substantially same, thickness of wet solder is unified.

By preparing a conductive foil, forming a conductive pattern in projection shape by half-etching, and forming a flow-prevention film of an electrical connection means on the projection shape conductive pattern, and by facing a semiconductor chip down on said conductive pattern and electrically connecting the semiconductor chip and said conductive pattern with electrical connection means, the electrical connection means is formed in desired shape and thickness by the flow-prevention film.

By arranging an electrode for radiation below the semiconductor chip, heat generating from the semiconductor chip is radiated to outside through the electrode for radiation.

BRIEF DESCRIPTION OF THE DRAWINGS

FIG. 1 is a view describing the semiconductor device of the invention.

FIG. 2 is a view describing the semiconductor device of the invention.

FIG. 3 is a view describing the semiconductor device of the invention.

FIG. 4 is a view describing the method of manufacturing the semiconductor device of the invention.

FIG. 5 is a view describing the method of manufacturing the semiconductor device of the invention.

FIG. 6 is a view describing the method of manufacturing the semiconductor device of the invention.

FIG. 7 is a view describing the method of manufacturing the semiconductor device of the invention.

FIG. 8 is a view describing the method of manufacturing the semiconductor device of the invention.

FIG. 9 is a view describing the method of manufacturing the semiconductor device shown in FIG. 3.

FIG. 10 is a view describing the semiconductor device of the invention.

FIG. 11 is a view describing the conventional semiconductor device.

FIG. 12 is a view describing the conventional semiconductor device.

DESCRIPTION OF THE PREFERRED EMBODIMENTS

First mode for carrying out describing a semiconductor device

Figure 1A:
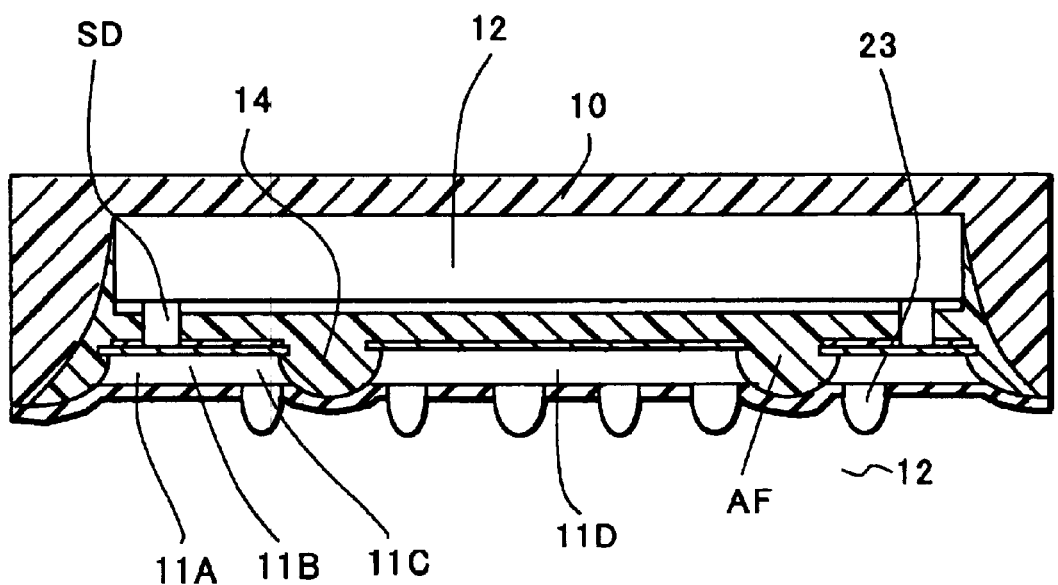
[FIG. 1]
Figure 1B:
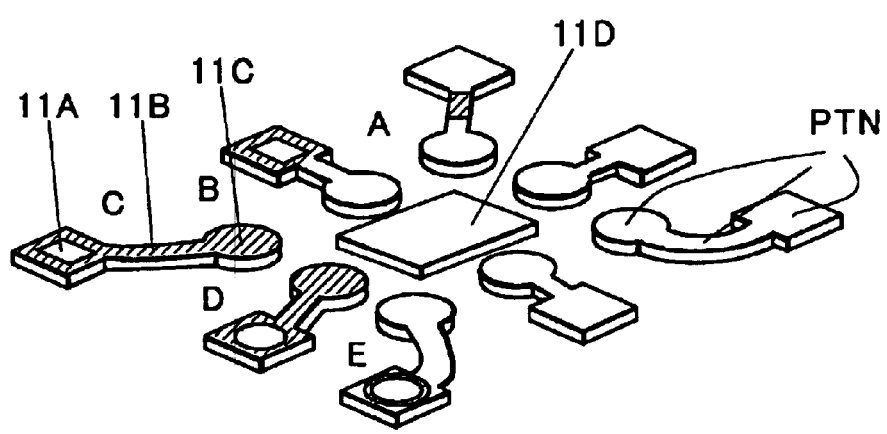
Figure 2A:
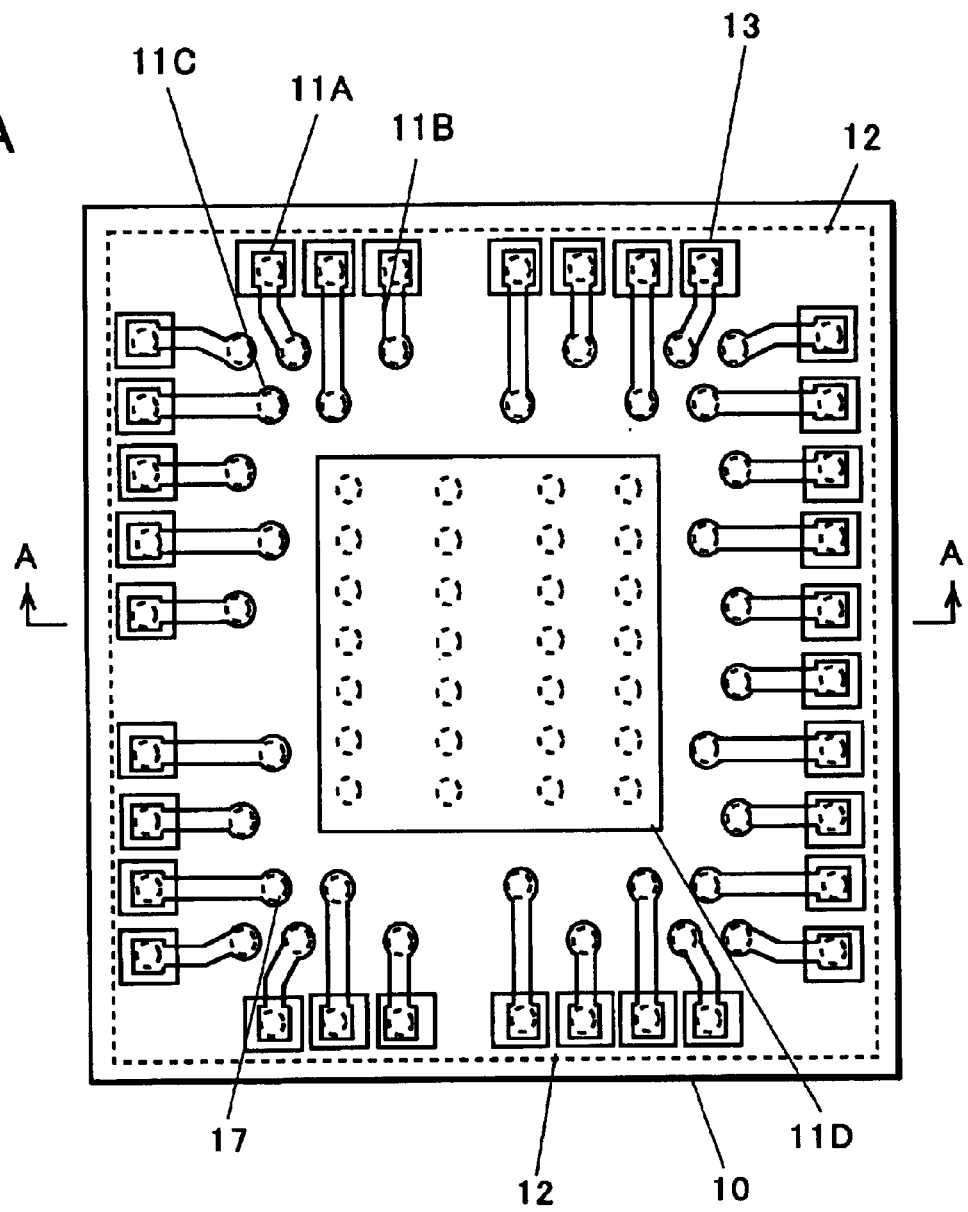
[FIG. 2]
Figure 2B:
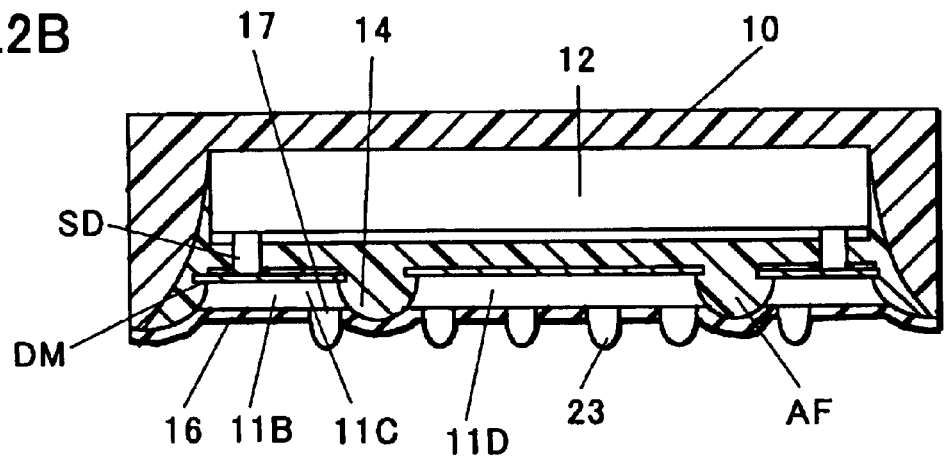

First, a semiconductor device of the invention is described referring FIG. 1 and FIG. 2. FIG. 2A is a plan view of the semiconductor device, and FIG. 1A and FIG. 2B are section views cut with A—A line.

In the semiconductor device 12, the following elements are buried in a insulating resin 10: pads 11A, conductive paths 11B in one body with the pads 11A, external connection electrodes 11C provided at the other ends of the conductive paths 11B in one body with the conductive paths 11B. Further an electrode for radiating 11D provided at one area surrounded by the conductive patterns 11A, 11B, and 11C and a semiconductor chip 12 provided on the electrode for radiating 11D are buried. The semiconductor chip 12 is fixed to the electrode for radiating 11D too through under-fill material AF, and the front face of the semiconductor chip 12 is passivated by the under-fill material.

A bonding electrode 13 of the semiconductor chip 12 and the pad 11A are electrically connected through an electrical connecting means SD such as brazing material like solder, conductive paste, and anisotropic conductive resin.

The invention is to form a flow-prevention film so that these electrical connecting means SD do not flow. For example of solder, a flow-prevention film DM is formed at least a part of conductive patterns 11A to 11C as shown in FIG. 1B to prevent flow of solder. Film bad in wetting with solder, for example, high polymer or oxide film formed on surface of Ni is used for the flow-prevention film. The flow-prevention film DM may be formed at the electrode for radiating. This can improve adhesiveness with the under-fill material AF. In the figure, the electrode for radiating 11D and the semiconductor chip 12 are not connected electrically because the bonding electrode 13 is not provided at center of front face of the semiconductor chip 12. However in the case that the bonding electrode 13 is provided at center of front face of the semiconductor chip 12, the semiconductor chip may be connected to the electrode for radiating 11D.

A plan shape of the flow-prevention film is shown with hatching in FIG. 1B.

Although five patterns of type A to type E are formed on the conductive patterns 11A to 11C, one of them is selected. Although the electrode for radiating 11D is shown small, the size thereof is decided depending on the size of the conductive patterns 11A to 11C.

Figure 5:
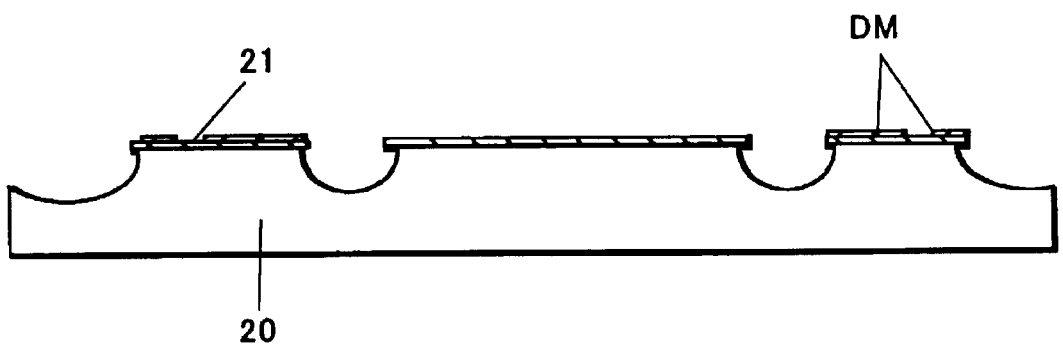
[FIG. 5]
Figure 6:
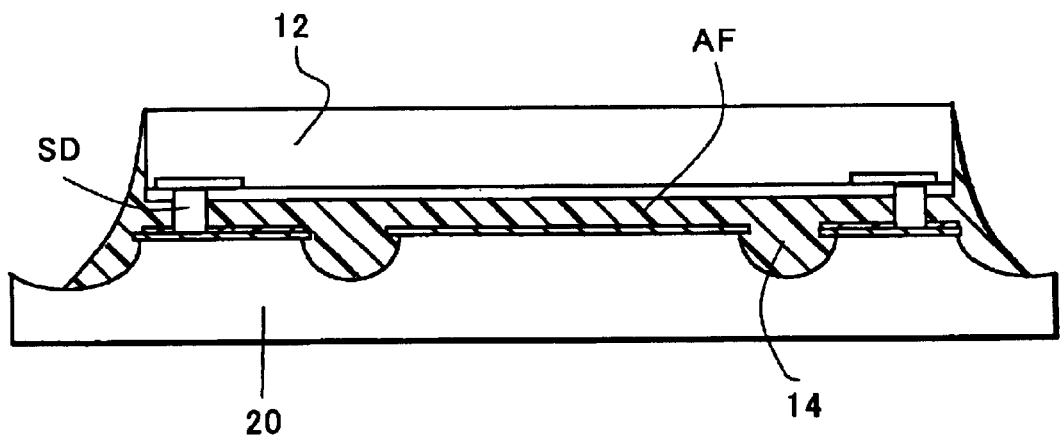
[FIG. 6]
Figure 7:
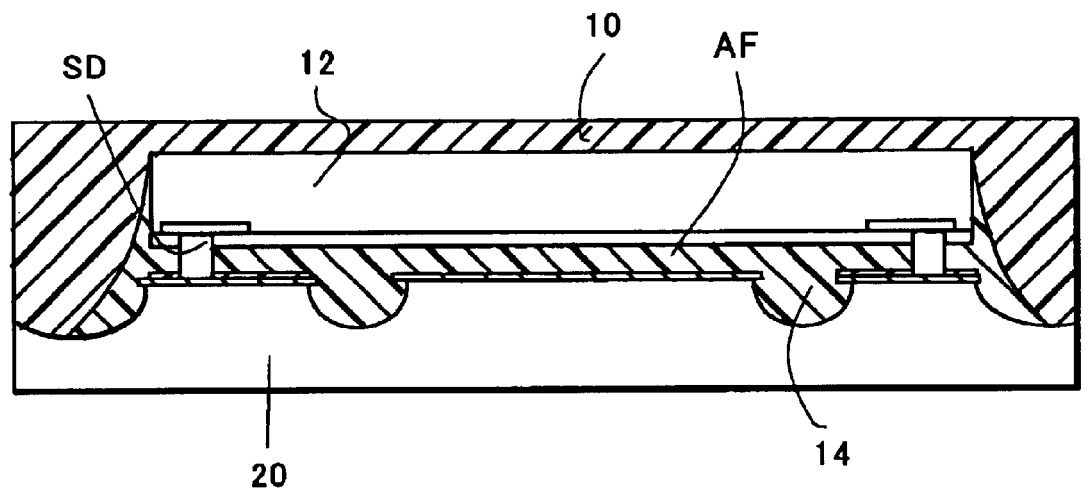
[FIG. 7]
Figure 8:
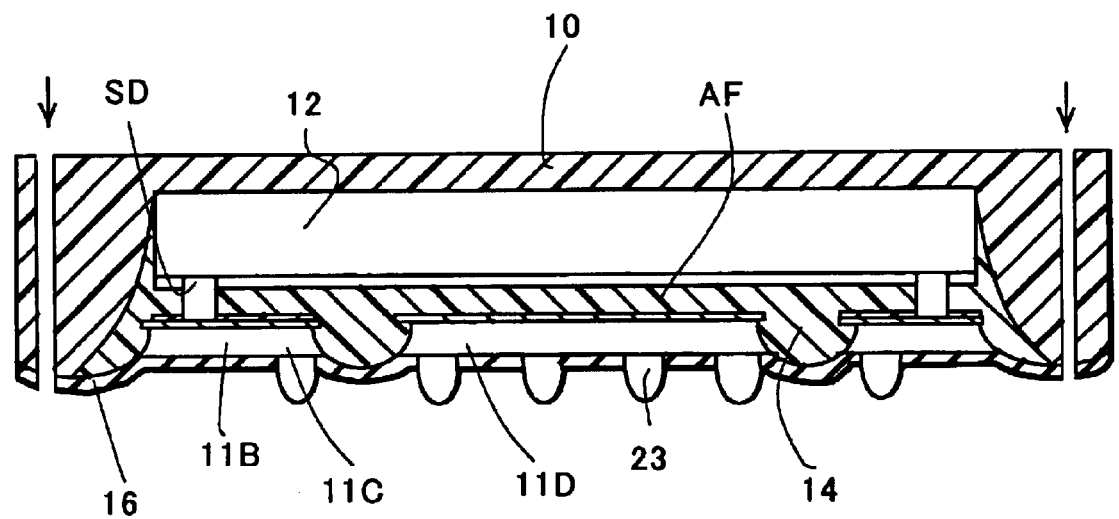
[FIG. 8]

In the pattern shown in type A, the flow-prevention film DM is provided at border of the pad 11A and the conductive path 11B, and the electrical connection means is formed at substantially entire area of the pad 11A. The flow-prevention film DM may be formed including entire area of the conductive path 11B or the external connection-electrode 11C. In type B, the flow-prevention film DM is formed on the pad 11A, and a part corresponding to the arranged area of the electrical connection means is removed. In type C, adding to the formed area of type B, the flow-prevention film DM is formed on the conductive path 11B and the external connection electrode 11C. In type D, an opening of the type C is changed to circle from rectangle. In type E, the flow-prevention film DM is formed on the pad in ring shape. Although pad 11A is shown in rectangle, it may be circle. The flow-prevention film DM prevent flow of brazing material such as solder, conductive paste such as Ag paste, and conductive resin, and these electrical connection means consist of bad material in wetting. For example, in case that solder is provided at type D, when the solder melts, the solder is dammed with flow-prevention film DM so as to form fine hemisphere by surface tension. Because passivation film is formed at periphery of the bonding electrode 13 of the semiconductor chip where the solder is attached, only the bonding electrode gets wet. Therefore by connecting the semiconductor chip and the pad through solder, the both are fixed in adductor shape keeping definite height. As size of the exposing portion and height of solder are possible to adjust by volume of solder provided thereon, a definite gap is provided between the semiconductor chip and the conductive pattern. Therefore it is possible to fill washing liquid into the gap. It is possible to fill adhesive low in viscosity, under-fill material in the invention. By covering all area except connecting area with the flow-prevention film DM in the state shown in FIG. 5, it is possible to improve adhesiveness with under-fill material AF. In the case of omitting under-fill material AF, adhesiveness with the insulating resin 10 improves.

Side face of said conductive pattern 11A to 11D is etched with non-anisotropy, and has a curved structure because by forming with wet etching so as to generate anchor effect by the curved structure.

The structure consists of four materials: the semiconductor chip 12, a plural of conductive patterns 11A to 11C, the electrode for radiation 11D, under-fill material AF, and the insulating resin 10 burying them. In arranged area of the semiconductor chip 12, said under-fill material AF is filled on and between the conductive patterns 11A to 11D, particularly in the isolation trench 14 formed by etching so as to expose the back face. The insulating resin 10 seals all including these materials. Said pads 1A and semiconductor chip 12 are supported by the insulating resin 10 and the under-fill material AF.

The under-fill material consists of insulating material, and material infiltrating easily into gap between the semiconductor chip 12 and the conductive patterns 11A to 11D is desirable. As clear in the description below, the under-fill material AF may be provided to the back face of the semiconductor chip 12.

For the insulating resin, thermosetting resin such as epoxy resin and thermoplastic resin such as polyimide resin and polyphenylenesulfide are used. All kinds of resin are used if they are resins hardening using a die and covering by dipping and painting. For the conductive patterns 11A to 11D, conductive foil of Cu as main material, conductive foil of AL as main material, Fe—Ni alloy, layered product of Cu—AL, or layered product of Al—Cu—Al is used. Of course, even other material is possible to use, particularly conductive material to etch and to evaporate by laser is desirable. It is because that crystal structure grows more to X and Y directions than Z axis and is superior against mechanical strength, flexibility, and invasion of contaminant from outside.

The invention has a characteristic to pretend remove of the conductive pattern because the insulating resin 10 and the under-fill material AF are filled into even said isolation trench 14. By carrying out non-anisotropic etching using dry etching or wet etching for etching, the side faces of pads 11A is made into curved structure so as to generate anchor effect. As the result, the structure that the conductive patterns 11A to 11D do not remove from the package is realized.

Further the back face of the conductive patterns 11A to 11D expose at the back face of the package. Accordingly the back face of the electrode for radiation 11D is fixed with the electrode on the mounting board. The structure can radiate heat generating from the semiconductor chip 12 to the electrode of the mounting board, can prevent temperature rise of the semiconductor chip 12, and can increase driving current of the semiconductor chip 12. In the case of not considering the radiation, the electrode for radiation 11D may be omitted.

Because the conductive patterns 11A to 11D are supported by insulating resin 10 and under-fill material AF being sealing resin in the semiconductor device, a supporting board is not need. This construction is a characteristic of the invention. As described at the prior art, the conductive path of the conventional semiconductor device is supported by a supporting board (flexible sheet, printed board, or ceramic board), or supported by a lead frame, the construction which is not need originally is added. However the circuit device consists of necessary minimum components and does not need the supporting board so that the device has a characteristic to be thin, light, and inexpensive because of low material cost.

At the back face of the package, the conductive patterns 11A to 11D expose. By covering brazing material such as solder for example, at the area, the brazing material can get wet thickly because area of the electrode for radiation 11D is broad. Therefore brazing material of the back face of external connection electrode 11C is not wet at the electrode of the mounting board at fixing on the mounting board, so it is assumed to become bad connection.

To solve that, an insulating film 16 is formed at the back face of the semiconductor device 12. Circles of dotted line shown at the external connection electrodes and electrodes for radiation show the external connection electrodes 11C and electrodes for radiation 11D exposing from the insulating film 16. That is, as the insulating film 16 covers portions except the circles and size of circle portions is substantially same size, thickness of brazing material formed here is substantially same. This is similar as after solder printing and after reflow. This is similar about conductive paste such as Ag, Au, Ag—Pd and so on. By the structure, bad quality of the electrical connection means 23 are depressed.

An exposing portion 17 of the electrode for radiation 11D may be formed larger than exposing size of the external connection electrode 11C considering radiation of the semiconductor chip. As all of the external connection electrodes 11C are substantially same size, all area of the external connection electrodes 11C may be exposed, and a part of the back face of the electrode for radiation 11D may be exposed from the insulating film 16 with substantially same size as the external connection electrode 11C.

By providing the insulating film 16, it is possible to extend the conductive path provided at the mounting board to the back face of the semiconductor device. Although the conductive path provided at the mounting board side is generally is arranged going around the fixed area of said semiconductor device, forming said insulating film 16 can arrange without going around.

Figure 3:
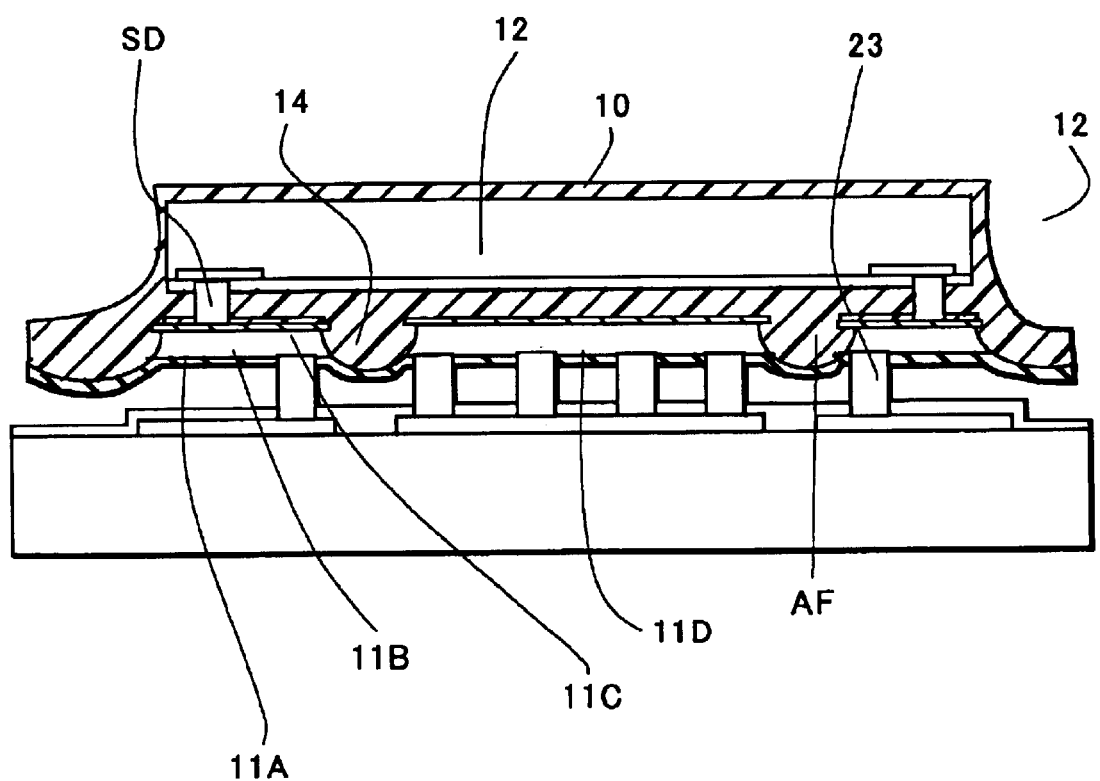
[FIG. 3]

FIG. 3 is a variation example of the semiconductor chip 12 shown in FIG. 1. Here under-fill material AF is formed to the back face of the semiconductor chip 12, and the insulating resin 10 is omitted.

Second mode for carrying described a method of manufacturing of a semiconductor The method of manufacturing shows the method of manufacturing of the semiconductor chip 12 shown in FIG. 1, FIG. 4 to FIG. 8 are section views corresponding to A—A line of FIG. 2A.

Figure 4:
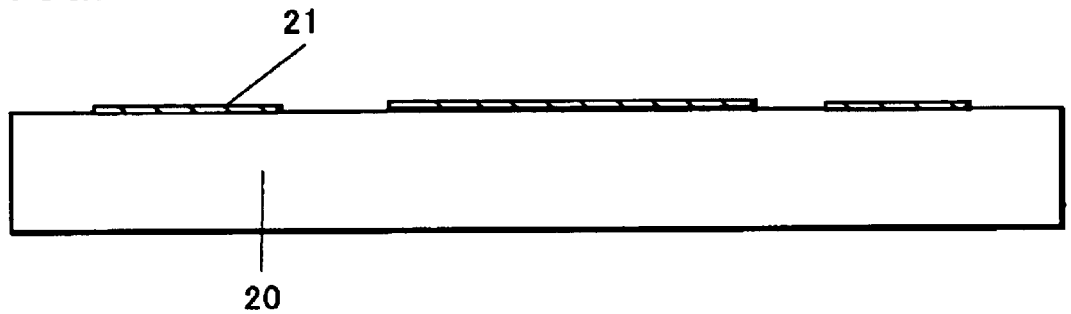
[FIG. 4]

First, a conductive foil 20 is provided as FIG. 4. Thickness thereof is desirably 10 $\mu$m to 300 $\mu$m, here rolled copper foil of 70 $\mu$m is used. Next on the front face of the conductive foil 20, a conductive film 21 or a photo resist is formed as etching-resist. The pattern is same pattern as the pads 11A, the conductive paths 11B, the external connection electrode 11C, and the electrodes for radiation 11D in FIG. 1B. In the case of using the photo resist instead of the conductive film 21, a conductive film such as Au, Ag, Pd or Ni may be formed at a part corresponding to at least pad in the lower layer of the photo resist. This is because surface of Cu is easy to oxidize and bad soldering possibly occurs. These films are able to solder-connect without considering oxidation of Cu. (Refer FIG. 4 about the above.)

Next, a flow-prevention film DM is formed on the patterned conductive film 21 and is half-etched. Depth of etching may be thinner than thickness of conductive foil 20. The thinner the depth of etching, forming the finer pattern is possible. The flow-prevent film DM may be formed after half-etching using the conductive film 21 as a mask. By the forming, almost all surface of under-fill material are covered by the flow-prevent film DM so as to improve adhesiveness.

By half-etching, conductive patterns 11A to 11D appear at surface of the conductive foil 20 in projection shape. As above-mentioned, here Cu foil formed by roll and made of Cu as main material is used for the conductive foil 20. For the conductive foil, conductive foil made of AL, conductive foil made of Fe—Ni alloy, layered product of Cu—AL, or layered product of Al—Cu—Al may be used. Especially the layered product of Al—Cu—Al prevents bend appearing by difference of coefficient of thermal expansion.

In the case of half-etching using photo resist, after finishing patterning of the conductive film 21 and patterning of the flow-prevent film DM, the photo resist is formed making substantially same as the conductive pattern and these films are half-etched through the photo resist. The flow-prevent film DM may be formed after half-etching. (Refer FIG. 5 about the above.)

Next, there is a process to connect a semiconductor chip 12 electrically and to form under-fill material AF.

Generally the semiconductor chip 12 having solder balls at bonding electrode 13 side is provided, solder paste is provided at pad 11A side, and the semiconductor chip 12 is bonded temporarily by adhesion of the solder paste. Next the conductive foil is solder-melted in an oven. As the flow-prevent film DM is formed, solder is kept with desired thickness without flowing.

Therefore it is possible to wash dirt such as flux attaching between the semiconductor chip 12 and the conductive patterns 11A to 11D, and it becomes easy that under-fill material AF enters as follows.

After fixing by solder SD, the under-fill material AF is painted so as to penetrate between the semiconductor chip 12 and the conductive patterns 11A to 11D. The under-fill material AF may be painted so as to expose the back face of the semiconductor chip 12, or so as to cover the back face of the semiconductor chip 12.

The semiconductor chip is mounted without using the supporting board and with face down type, and has characteristic that entire thickness of the package is made thin as thickness as the thin metal wire is raised. (Refer to FIG. 6 about the above.)

A insulating resin 10 is formed so as to cover the conductive patterns 11A to 11D formed by half-etched, the semiconductor chip 12, and the connection means SD. For the insulating resin, both of thermoplasticity and thermosetting property may be used.

Transfer molding, injection molding, dipping, or painting realizes the resin. For the resin material, thermosetting resin such as epoxy resin is realized by transfer molding and thermoplastic resin such as liquid polymer and polyphenylenesulfide is realized by injection molding.

In the mode for carrying out, thickness of the insulating resin is adjusted so as to cover 100 μm upper from the back face of the semiconductor chip. The thickness may be made thick or thin considering strength of the semiconductor device. By contacting the back face of the semiconductor chip and a die, it is possible to expose the back face of the semiconductor chip from the package. Especially by making thin the insulating resin 10 formed on the back face of the semiconductor chip, or by exposing the back face of the semiconductor chip and arranging a radiation plate at the part, a structure to radiate more heat of the semiconductor chip is taken.

In the injection of resin, as the conductive patterns 11A to 11D are in one body with the sheet-shape conductive foil 20, position of the conductive patterns 11A to 11D does not shift at all as long as the conductive foil 20 does not shift.

As above-mentioned, in the insulating resin 10, the conductive patterns 11A to 11D formed as projection and the semiconductor chip 12 are buried, and the conductive foil 20 of lower part than the projection exposes at the back face. (Refer FIG. 7 about the above.)

Next, the conductive foil 20 exposing at the back face of the insulating resin 10 is removed and the conductive patterns 11A to 11D are individually separated.

Various methods are considered for the separating process, that is, the back face may be separated removing by etching or grinding by polishing or grinding. Both of them may be used. There is a problem that shavings of the conductive foil 20 and bur-shape rolled metal extended thin to outside cut into the insulating resin 10 and the under-fill material AF at grinding till the insulating resin 10 exposes for example. Therefore separating the conductive pattern by etching, the device is formed without that metal of the conductive foil 20 cuts into the insulating resin 10 and the under-fill material AF, which exist between the conductive pattern 11A to 11D. Thus short between the conductive pattern 11A to 11D of fine interval is prevented. By etching so that the conductive pattern exists inside from bottom portion of the isolation trench 14, insulating material filled in the isolation trench 14 comes out, extending distance is taken long as long as the coming-out so as to improve withstand high voltage.

In the case that plural units becoming the semiconductor device 15 are formed, dicing process is added after the separating process.

Although the units are separated individually using the dicing machine here, it is possible by chocolate breaking, pressing, and cutting.

Here the insulating film 16 is formed on the conductive patterns 11A to 11D exposing at the back face separated and is patterned so as to exposes the parts shown in circle of dotted line of FIG. 2A, and after that, is diced at the part shown by arrow to become the semiconductor device.

The solder 23 may be formed before or after dicing. Especially by forming the brazing material 23 with screen-printing and melting it, solders are formed in the plural semiconductor devices at one time. In the case that the electrical connection means SD and the external connection means 23 consist of brazing material, it is good to make melting point of the electrical connection means SD high.

The above method of manufacturing realizes a light, thin, short, small package where a semiconductor chip buried in insulating material.

Figure 9:
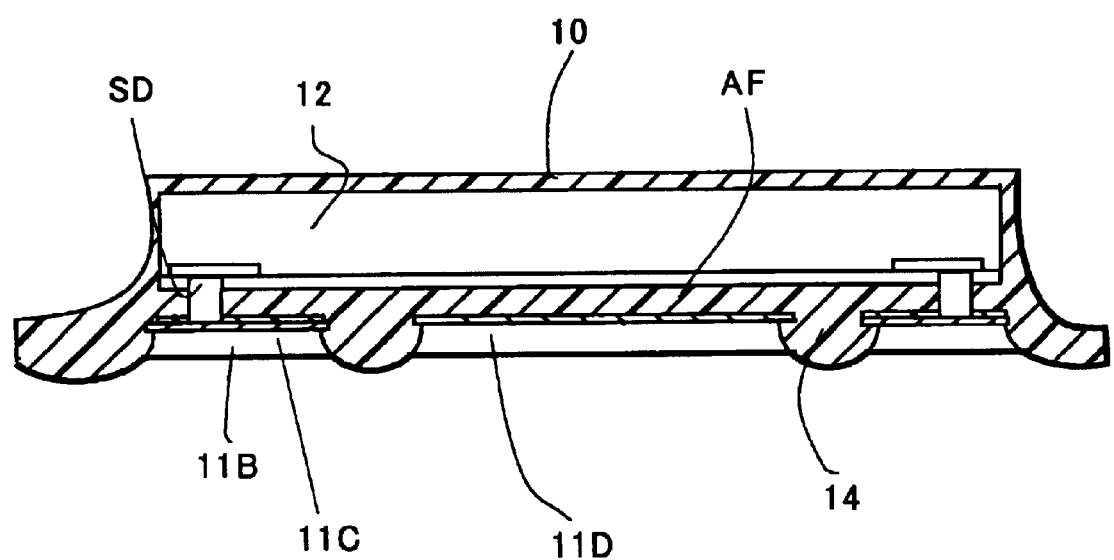
[FIG. 9]

The insulating material 10 may be omitted as shown in FIG. 9. After painting the under-fill material AF thick and solidifying in FIG. 6, the conductive patterns 11A to 11D may be separated by etching the back face of the conductive foil. After the insulating film 16 is patterned, the device is diced.

Next, effect generating by the above method of manufacturing.

First, as the conductive pattern is half-etched and supported in one body of the conductive foil, a board used for supporting past is removed.

Second, as the pad half-etched to make projection is formed on the conductive foil, it is possible to make the pad fine. Therefore it is possible to make width and gap of the pad narrower so as to form a small package in plan size.

Third, as the device consists of necessary minimum components: the conductive pattern, the semiconductor chip, the connection means, and sealing material, useless material is removed so as to realize thin semiconductor device extremely depressing cost.

Fourth, as the pads are formed becoming projection by half-etching and individually separated after sealing, tie bar and hanging lead are not need. Therefore forming and cutting tie bar (hanging lead) is not need at all in the invention.

Fifth, as the conductive patterns are isolated with each other by removing the conductive foil from the back face of the insulating resin after the conductive pattern becoming the projection is buried in the under-fill material and the insulating resin, bur of resin can be prevented from being generated between leads as the conventional lead frame.

Sixth, as the semiconductor is fixed to the electrode for radiation through the under-fill material and the electrode for radiation exposes from the back face thereof, heat generating from the semiconductor device is efficiently radiated from the back face thereof. By mixing the under-fill material with filler such as Si oxide film and aluminum oxide, radiation of the device is more improved. By unifying diameter of the filler, it is possible to function as a spacer. In this case, gap between the semiconductor chip and the conductive pattern is uniformed without forming a flow-prevention film.

Third mode for carrying out describing a semiconductor device

Figure 10A:
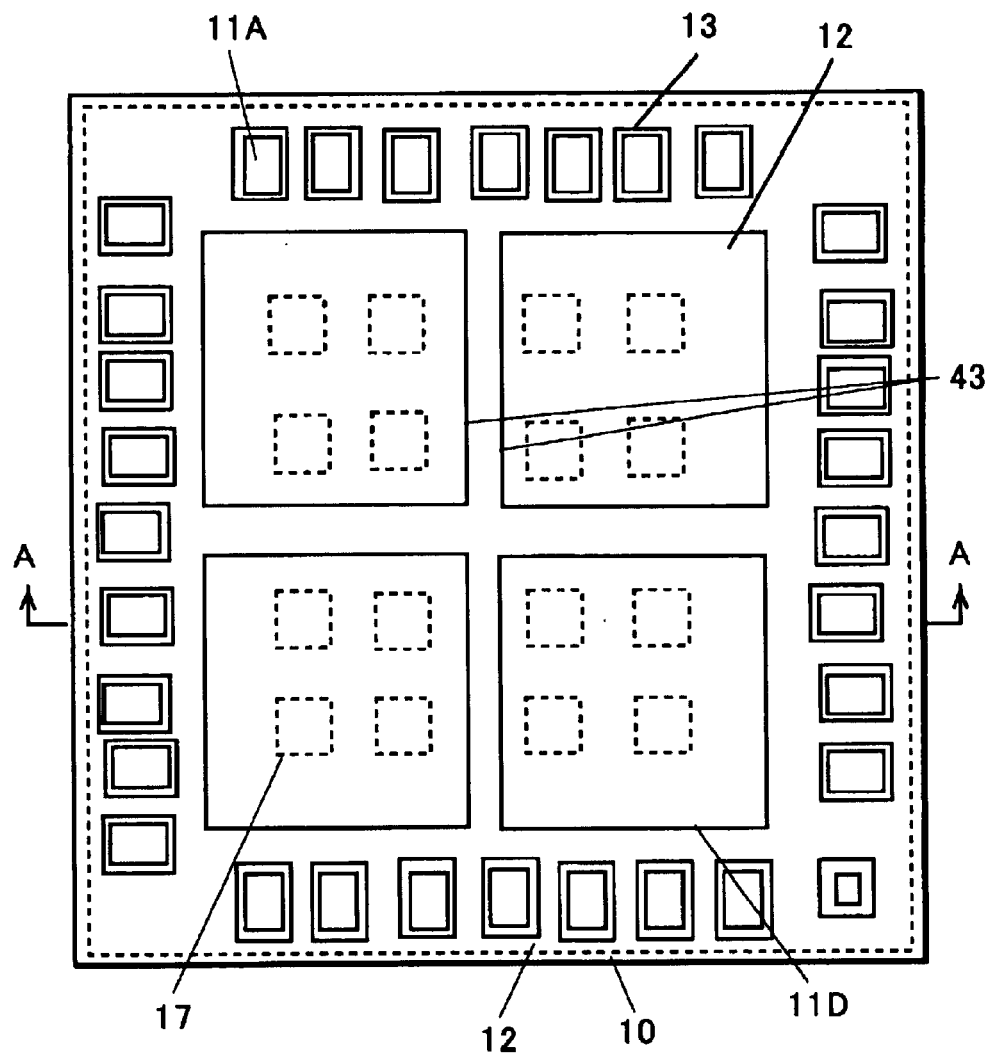
[FIG. 10]
Figure 10B:
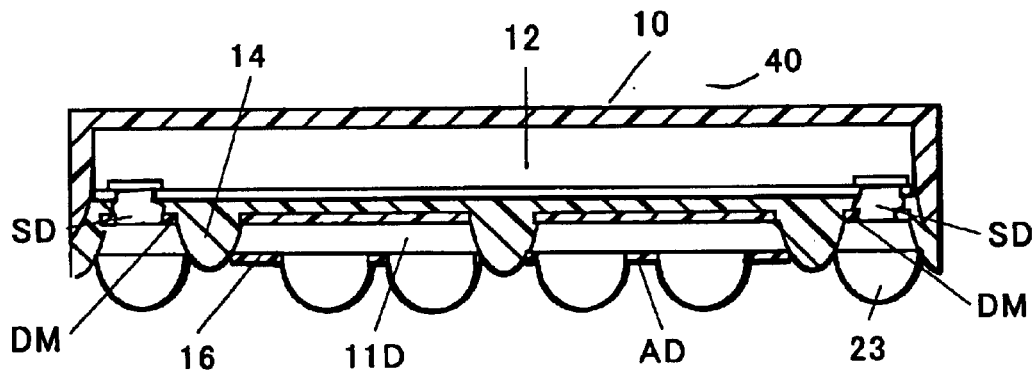
Figure 11A:
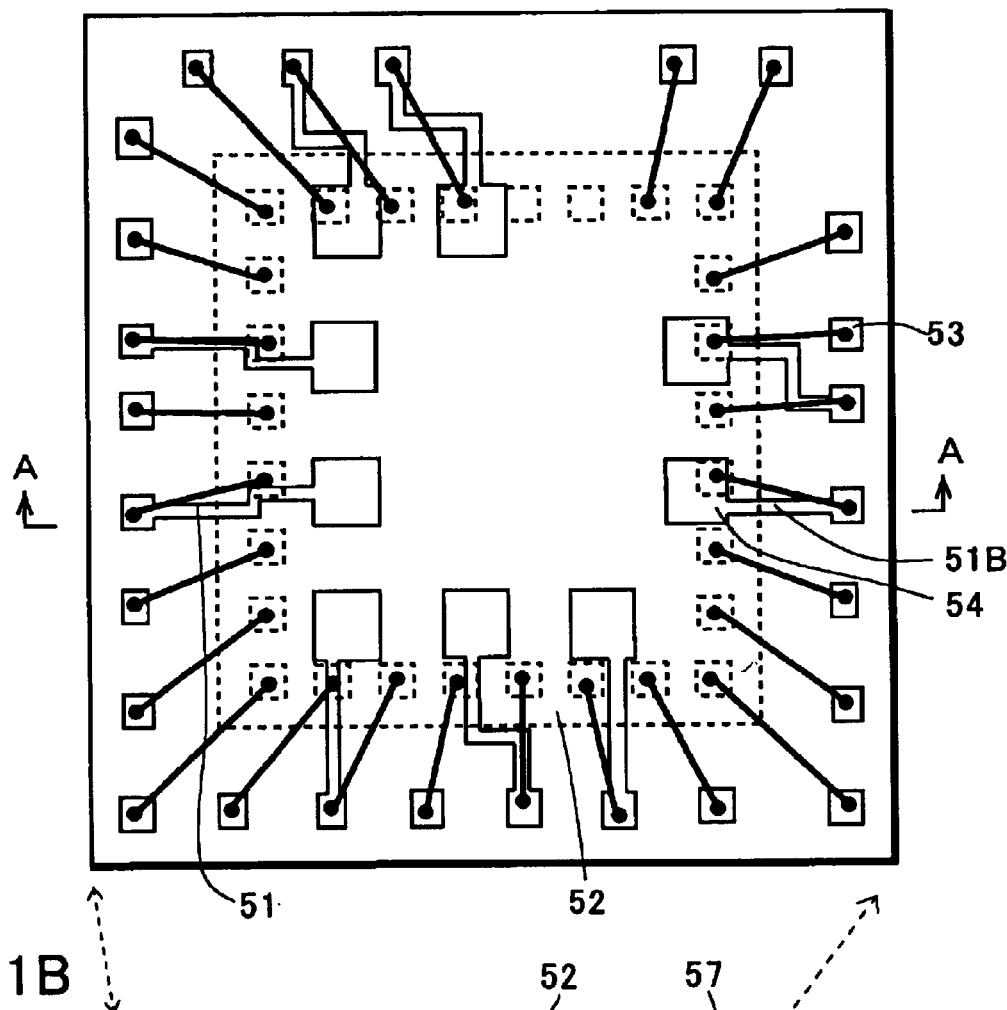
[FIG. 11]
Figure 11B:
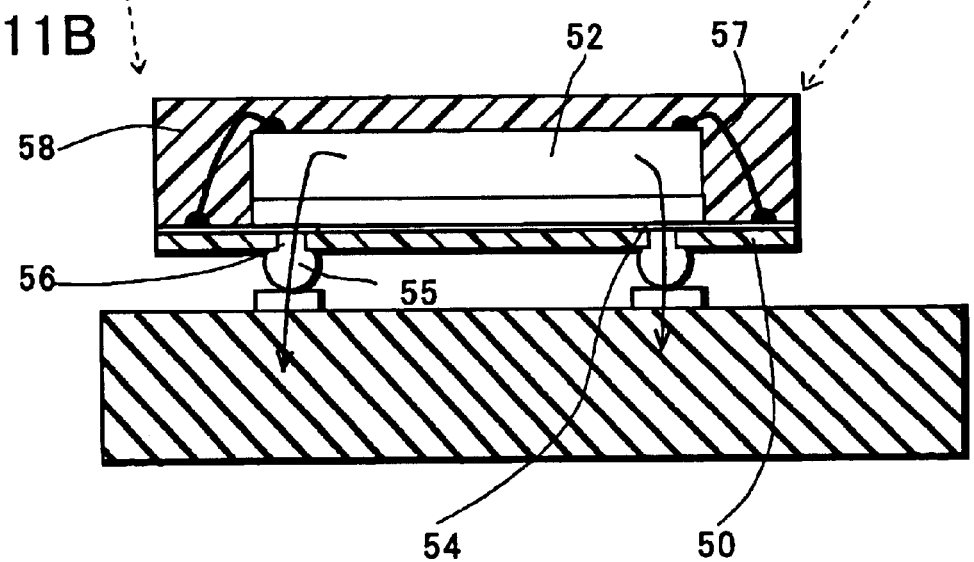
Figure 12A:
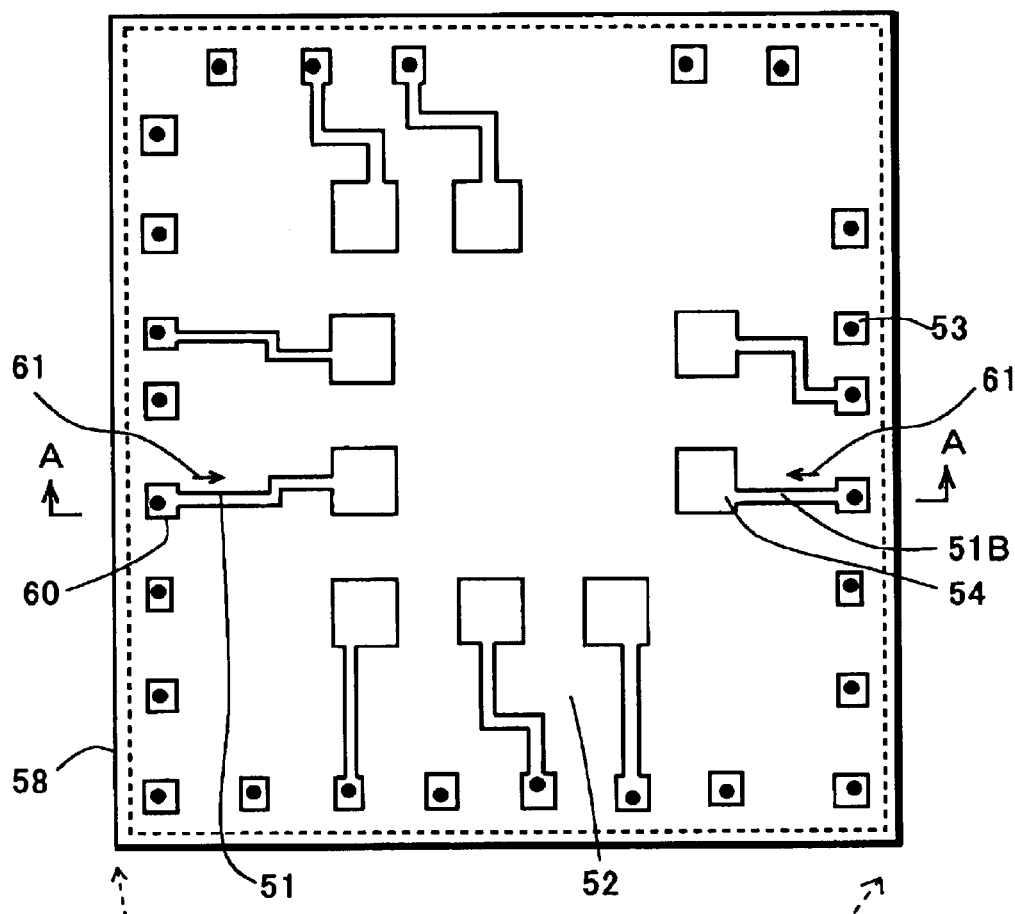
[FIG. 12]
Figure 12B:
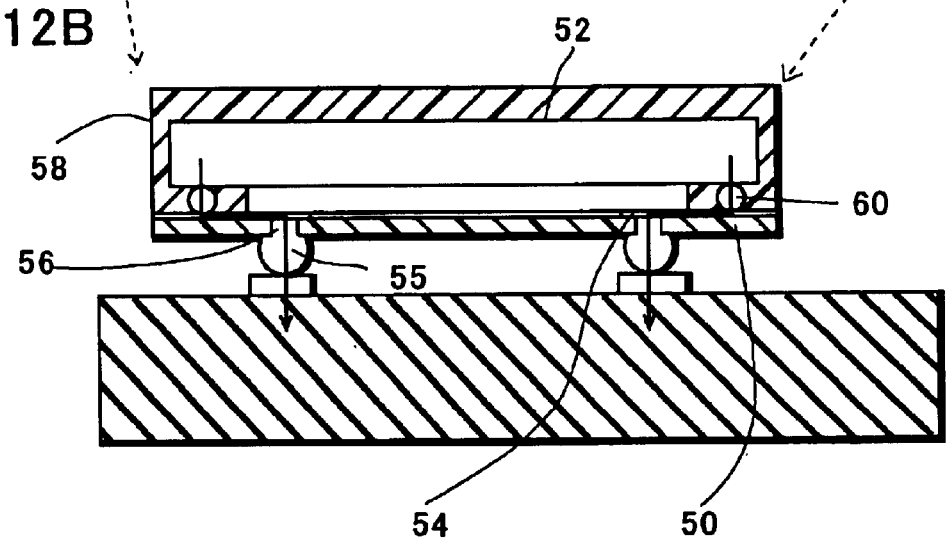

FIG. 10 shows the semiconductor device 40. FIG. 10A is a plan view of the device, and FIG. 10B is a section view cut by A—A line.

Although the pad 11A is formed in one body with the conductive path 11B and the external connection electrode 11C in FIG. 2, here the back face of the pad 1A becomes the external connection electrode.

As the back face of the pad 11A is formed in rectangle, the pattern exposing from the insulating film 16 is formed in same pattern as said rectangle. The isolation trenches 43 are formed so that the electrode for radiation 11D is divided to plural considering adhesion with the under-fill material.

Further, a conductive film of a material different from the pad may be formed on the upper face of said pad. The conductive film can be used as a mask for forming an isolation trench, and after forming, the conductive film can be remained as an eave protruding into the isolation trench. Thereby an insulating resin can prevent from being removed from the isolation trench.

As the method of manufacturing is substantially same as the above-mentioned method of manufacturing, the description is omitted.

As clear from the above description, in the invention, by forming the flow-prevention film on the conductive pattern, the electrical connection means does not flow along the conductive pattern, and it is possible to control shape and thickness of the electrical connection means. Therefore after the semiconductor chip and the conductive pattern are connected through the electrical connecting means, washing between them becomes possible. As the gap thereof does not become narrow, it is possible for resin having flowability to come into.

AS the electrode for radiation positioning at the back face of the semiconductor chip exposes, radiation of the semiconductor chip is improved. Further as the supporting board is not used, a thin and light package is realized.

The device consists of necessary minimum components of the conductive pattern, the semiconductor chip, and the insulating resin, and becomes a circuit device useless for resources.

What is claimed is:

1. A semiconductor device comprising:

a semiconductor chip;

a bonding electrode provided under and connected to the semiconductor chip;

a pad provided facing the bonding electrode of the semiconductor chip;

an electrical connection means for connecting electrically said pad to the bonding electrode;

a flow-prevention film provided on the pad and having an opening disposed where the electrical connection means is provided to prevent the electrical connection means from flowing;

an electrode for heat radiation disposed below the semiconductor chip and separated from the pad by trenches;

an under-fill material disposed between the semiconductor chip and the pad and filling in the trenches between the pad and the electrode; and an insulating resin integrally sealing said semiconductor chip.

2. A semiconductor device according to claim 1, further comprising:

a conductive path disposed underneath the semiconductor chip and connected to the pad;

an external connection electrode disposed underneath the semiconductor chip and connected to the conductive path, wherein said insulating resin seals said semiconductor chip while exposing a back face of said pad, and said flow-prevention film is provided also on said conductive path.

3. A semiconductor device according to claim 1, further comprising:

a conductive path disposed underneath the semiconductor chip and connected to the pad;

an external connection electrode disposed underneath the semiconductor chip and connected to the conductive path, wherein said semiconductor chip is fixed by an insulating adhesive provided on said external connection electrode, and said flow-prevention film is provided also on said conductive path.

4. A semiconductor device according to claim 1, further comprising:

additional pads disposed underneath the semiconductor chip;

a plurality of conductive paths disposed underneath the semiconductor chip, each conductive path connected to each pad, respectively;

a plurality of external connection electrodes disposed underneath the semiconductor chip, each external connection electrode connected to each conductive path, respectively, wherein said semiconductor chip are fixed to the pads, conductive paths, and the external connection electrodes by the under-fill material, and the flow-prevention film for suppressing flow of said electrical connection means is provided also on said conductive paths.

5. A semiconductor device according to claim 4, wherein said under-fill material comprises a mixture of insulating material and filler.

6. A semiconductor device according to claim 1, further comprising:

additional pads disposed entirely underneath the semiconductor chip;

additional electrodes for heat radiation disposed underneath the semiconductor chip and surrounded by said pads, wherein said semiconductor chip is fixed to the pads and the electrodes for heat radiation with the under-fill material.

7. A semiconductor device according to claim 1, wherein said electrical connection means comprises brazing material, and said flow-prevention is a high polymer film or a conductive material that has a poor wetting property with said brazing material.

8. A semiconductor device according to claim 1, wherein said high polymer is an insulating high polymer film.

9. A semiconductor device according to claim/wherein said conductive material is a Ni oxide film.

10. A semiconductor device according to claim 1, wherein said pad comprises Cu or Al as a main material formed by rolling or an iron-nickel alloy as a main material.

11. A semiconductor device according to claim 1, further comprising:

a conductive film materially different from the pad and disposed on said pad, wherein the conductive film protrudes beyond edges of the pad.

12. A semiconductor device according to claim 11, wherein said conductive film consists of Nickel, silver, gold, or palladium.

13. A semiconductor device according to claim 1, wherein said pad has curved sides.

14. The semiconductor device according to claim 1, wherein the opening of the flow-prevention film defines a shape of the electrical connection means to keep a predetermined distance between the pad and the semiconductor chip.

15. A semiconductor device comprising:

a semiconductor chip;

a bonding electrode provided under and connected to the semiconductor chip;

trenches to isolate the pad;

a pad provided facing the bonding electrode of the semiconductor chip;

an electrical connection means for connecting electrically said pad to the bonding electrode;

a flow-prevention film provided on the pad and having an opening disposed where the electrical connection means is provided to prevent the electrical connection means from flowing;

an under-fill material disposed between the semiconductor chip and the pad and the filling in the trenches; and an insulating resin integrally sealing said semiconductor chip.

16. A semiconductor device according to claim 15, further comprising:

a conductive path disposed underneath the semiconductor chip and connected to the pad;

an external connection electrode disposed underneath the semiconductor chip and connected to the conductive path, wherein said insulating resin seals said semiconductor chip while exposing a back face of said pad, and said flow-prevention film is provided also on said conductive path.

17. A semiconductor device according to claim 15, further comprising:

a conductive path disposed underneath the semiconductor chip and connected to the pad;

an external connection electrode disposed underneath the semiconductor chip and connected to the conductive path, wherein said semiconductor chip is fixed by an insulating adhesive provided on said external connection electrode, and said flow-prevention film is provided also on said conductive path.

18. A semiconductor device according to claim 15, further comprising:

additional pads disposed underneath the semiconductor chip;

a plurality of conductive paths disposed underneath the semiconductor chip, each conductive path connected to each pad, respectively;

a plurality of external connection electrodes disposed underneath the semiconductor chip, each external connection electrode connected to each conductive path, respectively, wherein said semiconductor chip are fixed to the pads, conductive paths, and the external connection electrodes by the under-fill material, and the flow-prevention film for suppressing flow of said electrical connection means is provided also on said conductive paths.

19. A semiconductor device according to claim 18, wherein said under-fill material comprises a mixture of insulating material and filler.

20. A semiconductor device according to claim 15, further comprising:

additional pads disposed entirely underneath the semiconductor chip;

additional electrodes for heat radiation disposed underneath the semiconductor chip and surrounded by said pads, wherein said semiconductor chip is fixed to the pads and the electrodes for heat radiation with the under-fill material.

21. A semiconductor device according to claim 15, wherein said electrical connection means comprises brazing material, and said flow-prevention is a high polymer film or a conductive material that has a poor wetting property with said brazing material.

22. A semiconductor device according to claim 21, wherein said high polymer is an insulating high polymer film.

23. A semiconductor device according to claim 21, wherein said conductive material is a Ni oxide film.

24. A semiconductor device according to claim 15, wherein said pad comprises Cu or Al as a main material formed by rolling or an iron-nickel alloy as a main material.

25. A semiconductor device according to claim 15, further comprising:

a conductive film materially different from the pad and disposed on said pad, wherein the conductive film protrudes beyond edges of the pad.

26. A semiconductor device according to claim 25, wherein said conductive film consists of Nickel, silver, gold, or palladium.

27. A semiconductor device according to claim 15, wherein said pad has curved sides.

28. The semiconductor device according to claim 15, wherein the opening of the flow-prevention film defines a shape of the electrical connection means to keep a predetermined distance between the pad and the semiconductor chip.

* * * * *